(12) United States Patent
Sun et al.

(10) Patent No.: US 9,231,579 B2
(45) Date of Patent: Jan. 5, 2016

(54) HIGHLY LINEAR BUFFER

(71) Applicant: SILICON LABORATORIES INC., Austin, TX (US)

(72) Inventors: Ruifeng Sun, Princeton, NJ (US); Mustafa H. Koroglu, Austin, TX (US); Ramin Khoini Poorfard, Austin, TX (US); Yu Su, Austin, TX (US); Krishna Pentakota, Austin, TX (US); Pio Balmelli, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 14/074,241

(22) Filed: Nov. 7, 2013

(65) Prior Publication Data

US 2015/0123714 A1   May 7, 2015

(51) Int. Cl.
*H03B 1/00* (2006.01)
*H03K 3/00* (2006.01)
*H03K 17/16* (2006.01)

(52) U.S. Cl.
CPC ..................................... *H03K 17/16* (2013.01)

(58) Field of Classification Search
CPC ............... H03K 3/01; H03K 19/0005; H03K 19/017545; H03K 17/16
USPC .......................................................... 327/108
See application file for complete search history.

(56) References Cited

U.S. PATENT DOCUMENTS

| 8,334,917 B2* | 12/2012 | Atlas et al. ............... 348/304 |
| 8,410,824 B2* | 4/2013 | Mehdizad Taleie et al. .. 327/108 |
| 8,610,456 B2* | 12/2013 | Chiaburu et al. ............... 326/30 |
| 2009/0237125 A1* | 9/2009 | Zhao et al. ............... 327/108 |
| 2010/0244907 A1* | 9/2010 | Gagne et al. ............... 327/109 |
| 2014/0018028 A1* | 1/2014 | Lemkin et al. ............... 455/269 |

FOREIGN PATENT DOCUMENTS

CN    102931972 A   *   2/2013   ............. 327/319

OTHER PUBLICATIONS

Kh. Hadidi and A. Khoei, "A Highly Linear Cascode-Driver CMOS Source-Follower Buffer," ICECS '96, pp. 1243-1246.

Kh. Hadidi, et al., "A Novel Highly Linear CMOS Buffer," International Conference on Electronics, Circuits and Systems, vol. 3, 1998. pp. 369-371.

* cited by examiner

*Primary Examiner* — Sibin Chen
*Assistant Examiner* — Metasebia Retebo
(74) *Attorney, Agent, or Firm* — Meyertons, Hood, Kivlin, Kowert & Goetzel, P.C.

(57) ABSTRACT

Techniques relating to buffer circuits. In one embodiment, a circuit includes a first transistor configured as a source follower and a feed-forward path coupled to the gate terminal of the first transistor and the drain terminal of the first transistor. In this embodiment, the feed-forward path includes circuitry configured to decouple the feed-forward path from a DC component of an input signal to the gate terminal of the first transistor. In this embodiment, the circuitry is configured to reduce a drain-source voltage of the first transistor based on the input signal. In some embodiment, the feed-forward path includes a second transistor configured as a source follower and the source terminal of the second transistor is coupled to the drain terminal of the first transistor. In various embodiments, reducing the drain-source voltage may improve linearity of the first transistor.

17 Claims, 6 Drawing Sheets

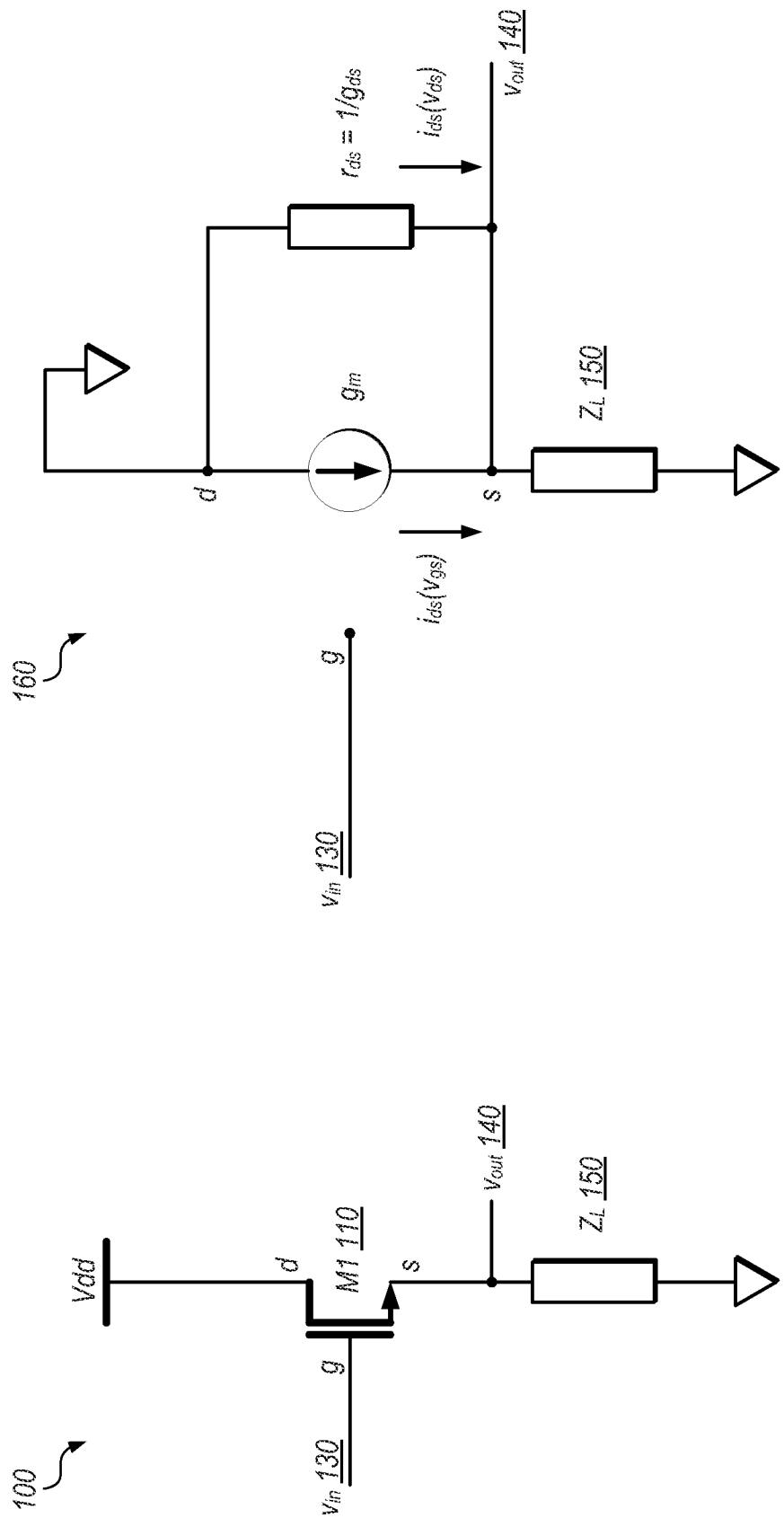

US 9,231,579 B2

HIGHLY LINEAR BUFFER

BACKGROUND

1. Technical Field

This disclosure relates to analog circuits and more particularly to a highly linear buffer circuit.

2. Description of the Related Art

Buffer circuits are often used to transfer a signal from a circuit with a given impedance level to another circuit with a different impedance level. For example, when transmitting radio frequency (RF) signals using a cable (e.g., for cable television), a buffer may be used between the circuitry generating the signal and the cable itself. Cable often has low impedance (e.g., low resistance and/or large capacitance). Buffer/driver circuits may or may not amplify an input signal. Typically, a linear relationship between an input signal to a buffer and an output signal from the buffer is preferable for preserving signal quality.

SUMMARY

Techniques are disclosed relating to highly linear buffer circuits.

In one embodiment, a circuit includes a first transistor having a first terminal, a second terminal, and a control terminal. In one embodiment, the transistor is a field-effect transistor and the control terminal is a gate terminal, the first terminal is a drain terminal, and the second transistor is a source terminal. In one embodiment, the circuit also includes a feed-forward path coupled to the control terminal and the first terminal. In this embodiment, the feed-forward path includes circuitry configured to decouple the feed-forward path from a DC component of an input signal to the control terminal. In this embodiment, the circuitry is also configured to reduce a voltage between the first and second terminals based on the input signal. In this embodiment, the second terminal is coupled to an output of the circuit. In various embodiments, the first transistor may be a bipolar junction transistor, a field effect transistor, or one of any of various types of transistors. In various embodiments, reducing the voltage between the first and second terminals may improve linearity of the first transistor and allow the first transistor to drive a low-impedance load.

In yet another embodiment, a circuit includes a first transistor having a first terminal, a second terminal, and a control terminal. In this embodiment, the circuit includes a feedback path coupled to the second terminal and the first terminal. In this embodiment the feedback path includes circuitry configured to reduce a voltage between the first and second terminals based on an output signal from the second terminal. In this embodiment, the control terminal is coupled to an input of the circuit. In one embodiment, the first transistor is configured as a source follower. In one embodiment, the feedback path includes a second transistor.

BRIEF DESCRIPTION OF THE DRAWINGS

FIG. 1A is diagram illustrating one embodiment of a circuit that includes a source follower transistor.

FIG. 1B is a diagram illustrating a simplified small-signal equivalent circuit for the circuit of FIG. 1A.

Figure 3:
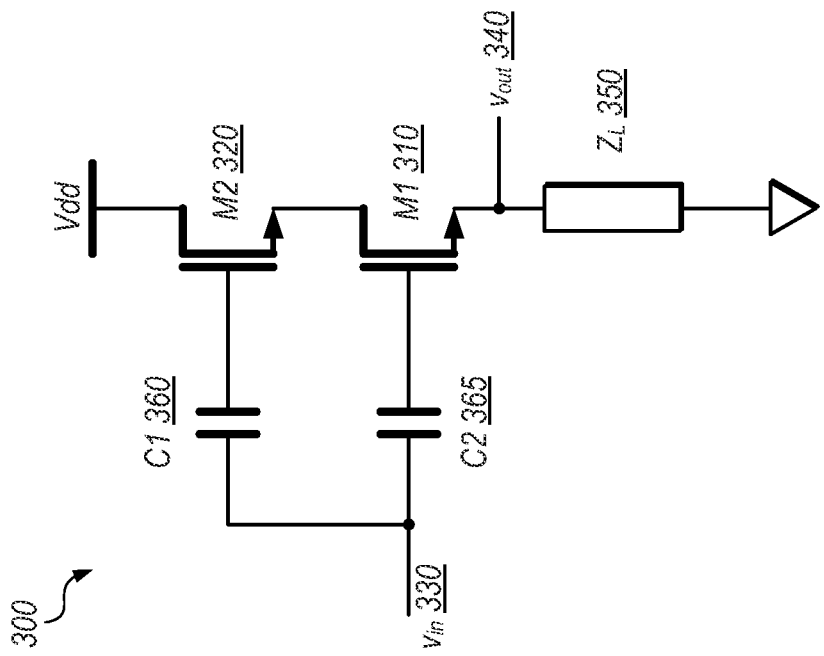
FIG. 3 is a diagram illustrating one embodiment of a circuit that includes a source follower transistor in a feed-forward path.

This specification includes references to "one embodiment" or "an embodiment." The appearances of the phrases "in one embodiment" or "in an embodiment" do not necessarily refer to the same embodiment. Particular features, structures, or various units, circuits, or other components may be described or claimed as "configured to" perform a task or tasks. In such contexts, "configured to" is used to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. §112(f) for that unit/circuit/component.

As used herein, the terms "first," "second," "third," etc. do not necessarily imply an ordering (e.g., temporal) between elements. For example, a reference to a "first" transistor and a "second" transistor may refer to any two different transistors. In short, references such as "first," "second," etc. are used as labels for ease of reference in the description and the appended claims.

As used herein, the term "coupled to" refers to a connection between components, whether direct or indirect. Thus, components that are coupled to each other may include intervening elements. The term "directly coupled" refers to a connection between components with no intervening elements.

DETAILED DESCRIPTION

This disclosure initially describes, with reference to FIGS. 1A-1B, an overview of a source follower circuit. It then describes exemplary embodiments of buffer circuits that include a feed-forward path with reference to FIGS. 2-5. FIG. 6 illustrates one embodiment of a method for operating a buffer circuit. In some embodiments, techniques described herein may provide highly linear buffer/driver circuits, especially when using small transistors with short-channel effects.

Referring to FIG. 1A, a diagram illustrating one embodiment of a circuit 100 that includes a source follower transistor is shown. In the illustrating embodiment, source follower transistor M1 110 is an n-type field effect transistor (FET) that includes gate, source, and drain terminals. In the illustrated embodiment, the drain terminal is coupled to a voltage Vdd, the source terminal is coupled to generate an output signal $v_{out}$ 140 and is also coupled to a load impedance $Z_L$ 150 (which is in turn coupled to ground), and the gate terminal is coupled to an input signal $v_{in}$ 130. In the illustrated embodiment, the signal at the source node is configured to "follow" the input signal at the gate node. Biasing circuitry is not shown to simplify illustration.

FIG. 1B illustrates a simplified small-signal equivalent circuit 160 to the circuit 100 of FIG. 1A. In the illustrated embodiment, $g_m$ represents transconductance and $g_{ds}$ represents an intrinsic output conductance of M1 (e.g., such that $r_{ds}$, the intrinsic output resistance, is equal to $1/g_{ds}$). In the illustrated configuration, the relationship between $v_{out}$ 140 and $v_{in}$ 130 may be specified by the equation:

$$\frac{v_{out}}{v_{in}} = \frac{g_m}{g_m + g_{ds} + 1/Z_L} \quad (1)$$

Circuit 100 may be used as a buffer or driver for signals in various applications. In many radio frequency (RF) applications, for example, various linearity requirements are often present. Nonlinearity may arise from a number of sources. In the illustrated embodiment, nonlinearity may be primarily caused by the transconductance $g_m$ and the intrinsic output conductance $g_{ds}$. As shown in equations 2a and 2b below, there may be a nonlinear relationship between the current flowing through each component and the voltage across each component:

$$i_{ds}(v_{gs}) = g_m \cdot v_{gs} + g'_m \cdot v_{gs}^2 + g''_m \cdot v_{gs}^3 + \ldots \quad (2a)$$

$$i_{ds}(v_{ds}) = g_{ds} \cdot v_{ds} + g'_{ds} \cdot v_{ds}^2 + g''_{ds} \cdot v_{ds}^3 + \ldots \quad (2b)$$

where $g'_{ds}$ represents $2^{nd}$-order nonlinear coefficients, $g''_{ds}$ represents $3^{rd}$-order nonlinear coefficients, etc. The overall $i_{ds}$ may be a combination of $v_{gs}$ dependent terms and $v_{ds}$ dependent terms, as well as potentially cross terms dependent on both $v_{gs}$ and $v_{ds}$ in some embodiments.

Note that another source of nonlinearity may be body transconductance $g_{mbs}$. In some embodiments, this is reduced or removed by connecting source and body nodes together such that $V_{bs}$ is zero.

Further, in conventional source followers, nonlinearity due to $g_m$ is typically suppressed because $v_{gs}$ may have a small amplitude relative to the input signal. However, nonlinearity due to $g_{ds}$ may persist and may be dominant, e.g., because $v_{ds}$ may be equal to $v_{out}$ and $v_{out}$ is almost equal to $v_{in}$, which may be large. In order to reduce this nonlinearity, in some embodiments, a source follower is configured such that the drain node "sees" a similar signal to the source node, such that variation in $v_{ds}$ during operation is greatly reduced.

Figure 2:
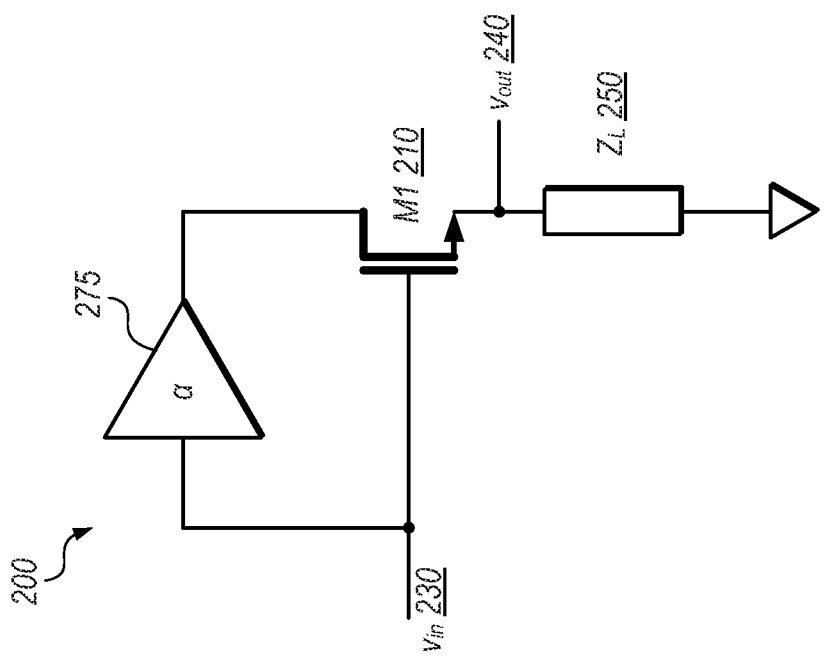
FIG. 2 is a diagram illustrating one embodiment of a circuit that includes a feed-forward path.

Referring now to FIG. 2, one embodiment of a circuit 200 that includes a feed-forward path 275 between the gate and drain nodes of a source follower is shown. In the illustrated embodiment, feed-forward path 275 is configured to reduce the drain-source voltage based on $v_{in}$ 230 in order to improve linearity of circuit 200 while maintaining stability. In the illustrated embodiment, feed-forward path 275 is configured to reduce variation in the drain source voltage based on $v_{in}$ 230 which may improve linearity in the response of circuit 200. Feed-forward paths are typically stable compared to feed-back paths, for example, and stability may be advantageous in various embodiments. In some embodiments, the drain-source voltage is reduced because both the drain and source voltages are based on $v_{in}$ 230. Further, the drain-source voltage may have less variation during operation in some embodiments, e.g., because the drain and source voltage are configured to change similarly to each other even when the coupling is not ideal. This may improve linearity of circuit 200.

In the illustrated embodiment, transistor M1 is a FET. In other embodiments, similar techniques may be used for any of various types of transistors, such as bipolar junction transistors (BJTs), for example. In various embodiments, a feed-forward path may be coupled between a control terminal of a transistor and one of the other terminals of the transistor. As used herein, the term "transistor" refers to a device with at least three terminals: a first terminal, a second terminal, and a "control terminal." A change in a voltage or current applied to the control terminal changes the current through the first and second terminals. For example, the control terminal of a FET is typically referred to as a "gate" terminal, while the first and second terminals are typically referred to as "drain" and "source." As another example, the control terminal of a BJT is typically referred to as the "base" terminal while the first and second terminals are typically referred to as "emitter" and "collector."

The term "source follower" includes its well-known meaning and refers to one of three basic FET transistor topologies in which the gate serves as an input and the source as an output. This may also be referred to as a "common-drain" configuration. Typically, source follower FETs operate in the saturation region. A similar BJT configuration is the "emitter follower" which includes its well-known meaning in the art and refers to a BJT topology in which the base serves as an input and the emitter as an output. This may also be referred to as a "common-collector" configuration and typically uses BJTs in the active region.

Referring now to FIG. 3, one embodiment of a circuit 300 that utilizes a source follower transistor M2 320 in a feed-forward path is shown. In the illustrated embodiment, circuit 300 is an n-type metal-oxide semiconductor (NMOS) circuit and also includes capacitors C1 360 and C2 365. In various embodiments, biasing circuitry (not shown) may be configured to operate transistors M1 and M2 in the saturation region.

In the illustrated embodiment, M2 and C1 are included in a feed-forward path from the gate terminal of M1 to the drain terminal of M1. In the illustrated embodiment, if the coupling between gate and drain terminals of M1 through M2 is ideal (e.g., the coupling coefficient between the gate and the drain is that same as the coupling coefficient between the gate and source), the drain-source voltage of M1 is zero. Even if the coupling is not ideal, the drain-source voltage of M1 may be small and relatively stable, e.g., because the source terminal of both transistors are configured to follow the input signal.

Capacitors C1 and C2, in the illustrated embodiment, are AC coupling capacitors configured to couple transistors M1 and M2 while blocking DC components of an input signal. AC coupling capacitors may also be referred to as decoupling capacitors or DC blocking capacitors. In some embodiments, biasing resistors (not shown) may be used along with capacitors C1 and C2 to create high-pass filters for $v_{in}$ 330. In the illustrated embodiment, capacitor C1 is configured to decouple the feed-forward path (including M2) from the direct current (DC) component of $v_{in}$ 330. For example, C1 may appear as an open circuit at DC while passing higher-frequency AC signals, which may allow M1 and M2 to be separately biased. This may allow both M1 and M2 to operate in the saturation region, even though the source of M2 is directly coupled to the drain of M1 in the illustrated embodiment.

In some embodiments, circuit 300 may simply buffer the input signal without amplification. In some embodiments, transistors M1 and M2 may be nominally the same size (e.g., having the same length and width), while in other embodiments, transistors M1 and M2 may be different sizes.

Figure 4:
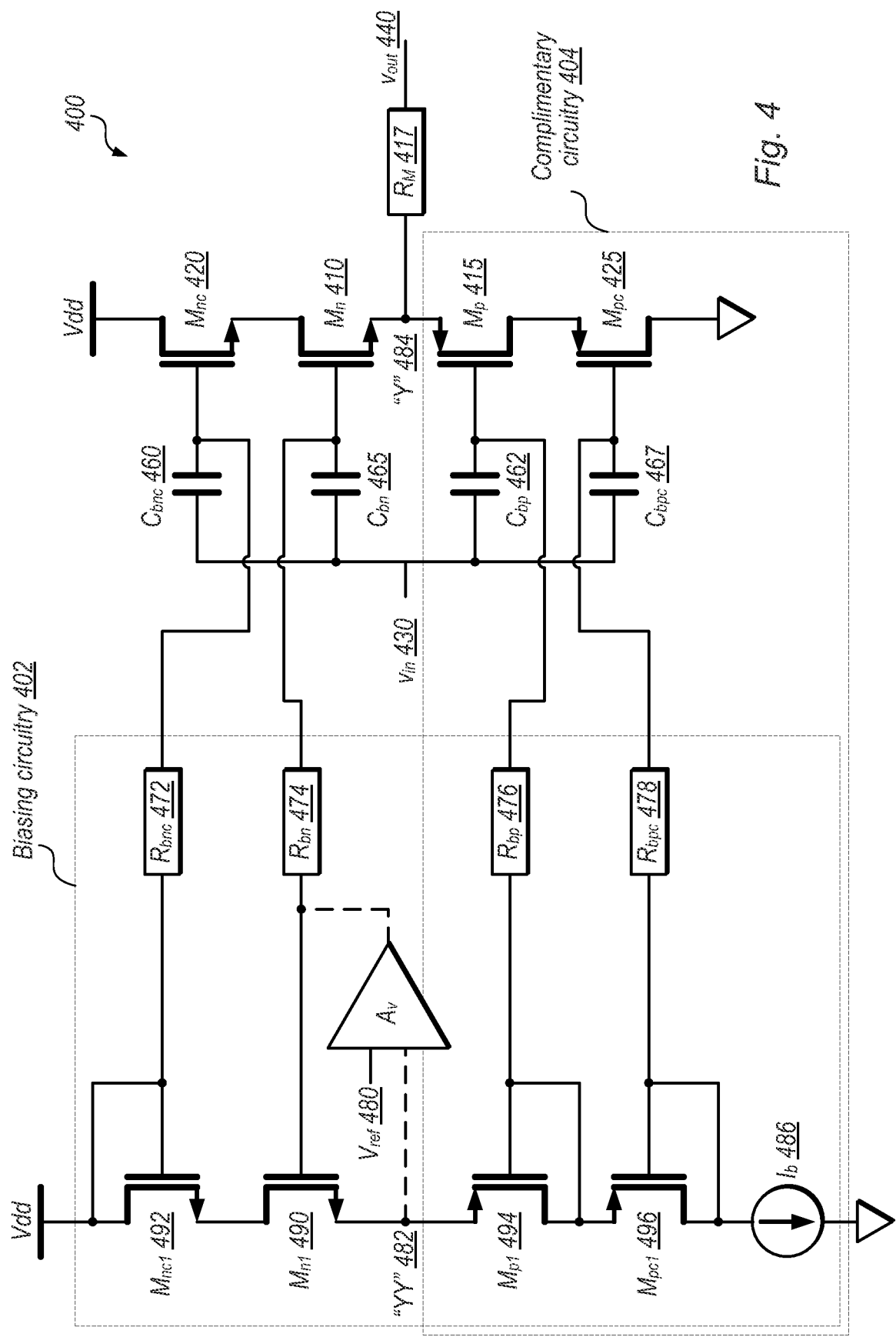
FIG. 4 is a diagram illustrating one embodiment of a complementary circuit that includes biasing circuitry.

Referring now to FIG. 4, one embodiment of a complementary circuit 400 that include biasing circuitry is shown. The illustrated embodiment includes p-type transistors 415, 425, 494, and 496, n-type transistors 410, 420, 492, and 490, biasing resistors 472, 474, 476, and 478, capacitors 460, 465, 462, and 467, matching resistor $R_m$ 417, and current source 486.

Biasing circuitry 402, in the illustrated embodiment, includes circuit elements used to operate transistors 410, 415, 420, and 425 in the saturation region. Biasing typically involves establishing pre-determined DC voltages or currents at various points in a circuit such that circuit components operate correctly. For example, transistors typically require specific DC voltages and currents for correct operation, which may be superimposed on an AC input signal. For example, BJTs may be biased to operate in the active mode and/or FETs may be biased to operate in saturation mode, in some embodiments. FIG. 4 shows an exemplary biasing circuitry configuration, but in other embodiments, other configurations are contemplated. In the illustrated embodiment, transistors 492, 494, and 496 are diode-connected. In some embodiments (not shown), transistor 490 may also be diode connected. However, in the illustrated embodiment, transistor 490 includes a feedback connection (connection illustrated using dashed lines) coupled to node YY 482 and based on $V_{ref}$ 480. In the illustrated embodiment, this feedback connection may stabilize the DC voltage level of the YY 482 and Y 484 nodes to follow reference voltage $V_{ref}$ 480.

Complementary circuitry 404, in the illustrated embodiment, includes p-type circuitry configured to implement the functionality of the n-type circuitry in a complementary fashion. Complementary circuits typically use complementary and symmetrical pairs of p-type and n-type transistors for various circuit functions. For example, in the illustrated embodiment, transistor 415 is configured to perform similar functionality to transistor 410 (which may be similar to that described above with reference to transistor M1 of FIG. 3). Complementary implementations may improve noise immunity, may have low static power consumption, and may reduce even-order nonlinear distortion. Complementary circuitry may be used in various embodiments with other circuit implementations in place of and/or in addition to FET/MOS implementations.

Matching resistor $R_m$ 417 may improve the performance of transistors 410 and 415 and may be selected to match an output load impedance on circuit 400. In some embodiments, circuit 400 may be used to buffer or drive a television cable, for example. "Resistors" are typically passive two-terminal components that implement electrical resistance such that current through the component is proportionate to voltage across the terminals. Resistors may be manufactured discretely or may be included in integrated circuits.

Figure 5:
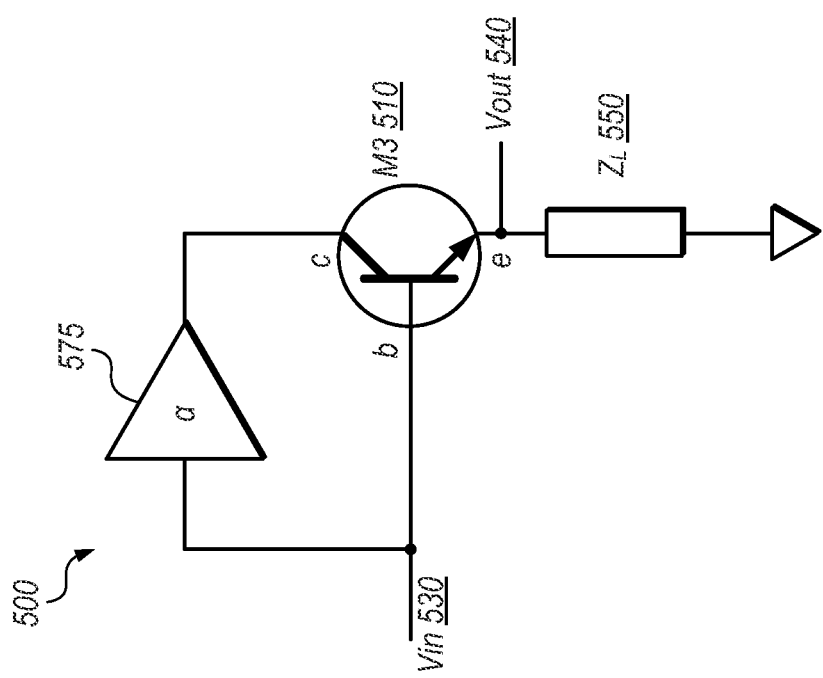
FIG. 5 is a diagram illustrating one embodiment of a circuit that includes a common collector transistor.
Figure 6:
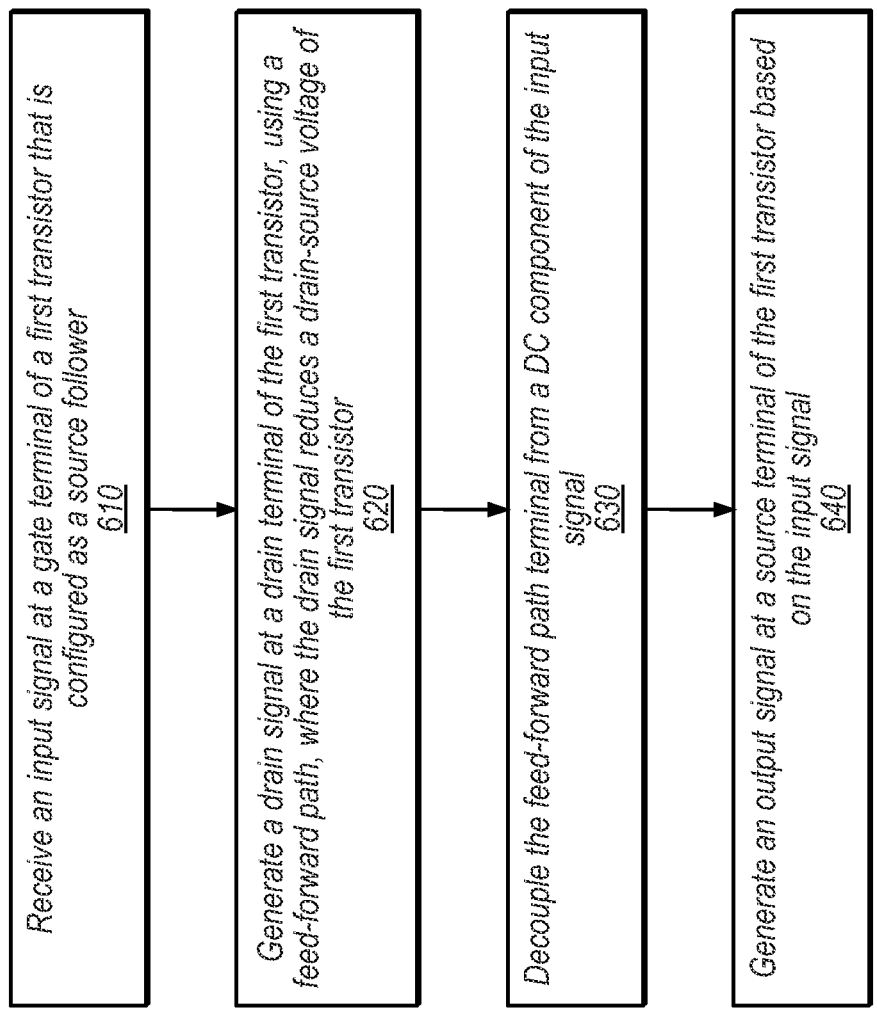
FIG. 6 is a flow diagram illustrating one embodiment of a method for operating a buffer circuit.

Referring now to FIG. 5, a diagram illustrating one embodiment of a circuit 500 that includes a BJT is shown. In the illustrated embodiment, circuit 500 includes BJT M3 510, feed-forward path 575, and $Z_L$ 550. FIG. 5 illustrates a similar configuration to FIG. 2, but using a BJT rather than a FET. In the illustrated embodiment, M3 is configured as an emitter follower and configured to operate in the active region. In the illustrated embodiment M3 includes base, collector, and emitter terminals. In various embodiments, transistors in the embodiments of FIGS. 2-5 may be replaced with any of various appropriate transistor types. For example, transistors M1 and M2 in FIG. 3 may be replaced with emitter follower BJTs in one embodiment. In the illustrated embodiment, feed-forward path 575 may be configured to reduce variation in the collector-emitter voltage of M3 which may improve linearity of circuit 500.

Referring now to FIG. 6, a flow diagram illustrating one exemplary embodiment of a method 600 for operating a buffer circuit is shown. The method shown in FIG. 6 may be used in conjunction with any of the computer systems, devices, elements, or components disclosed herein, among other devices. In various embodiments, some of the method elements shown may be performed concurrently, in a different order than shown, or may be omitted. Additional method elements may also be performed as desired. Flow begins at block 610.

At block 610, an input signal is received at a gate terminal of a first transistor that is configured as a source follower. The input signal may have AC and DC components. The DC component may be generated by biasing circuitry. The first transistor may be configured to operate in the saturation region. Flow proceeds to block 620.

At block 620, a drain signal is generated at a drain terminal of the first transistor. The drain signal is generated using a feed-forward path and the drain signal reduces a drain-source voltage of the first transistor. This may improve linearity between the gate terminal and source terminal of the first transistor. In some embodiments, the feed-forward path includes a second transistor configured to generate the drain signal to match a signal at a source terminal of the first transistor. Flow proceeds to block 630.

At block 630, the feed-forward path is decoupled from a DC component of the input signal. In one embodiment, the feed-forward path includes a capacitor configured to perform the decoupling. In one embodiment, the capacitor is coupled to a gate terminal of a second transistor in the feed-forward path. This may allow separate biasing of the first and second transistors while coupling the transistors to a given AC frequency. Flow proceeds to block 640.

At block 640, an output signal is generated at the source terminal of the first transistor based on the input signal. In some embodiments, the output signal is provided to a matching resistor and/or a television cable. Flow ends at block 640.

Figure 7:
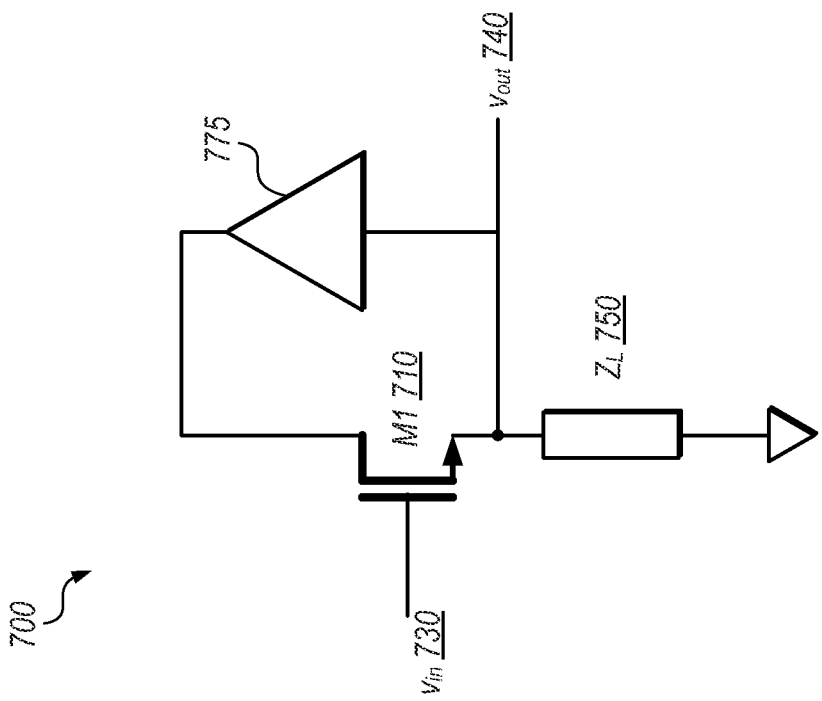
FIG. 7 is a diagram illustrating one embodiment of a circuit that includes a feedback path.

Referring now to FIG. 7, a diagram illustrating one embodiment of a circuit 700 that includes a feedback path is shown. In the illustrated embodiment, circuit 700 includes a source follower transistor M1 710, feedback path 775, and load 750. In the illustrated embodiment, feedback path 775 may be configured to reduce or eliminate the drain-source voltage of M1 based on $v_{out}$ 740. Further, the drain-source voltage of M1 may have less variation during operation in this embodiment, e.g., because the drain and source voltage are configured change similarly to each other.

In the illustrated embodiment, transistor M1 is a FET. In other embodiments, similar configurations may utilize any of various types of transistors, such as BJTs, for example. In various embodiments, a feedback path may be coupled between a terminal of a transistor used as an output terminal and another non-control terminal of the transistor.

Figure 8:
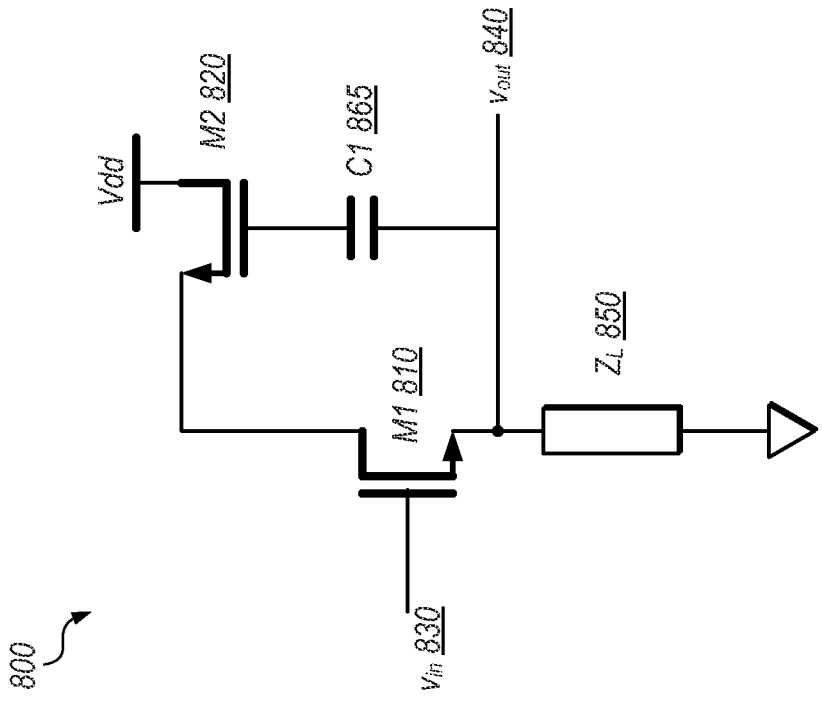
FIG. 8 is a diagram illustrating one embodiment of a circuit that includes a source follower transistor in a feedback path.

Referring now to FIG. 8, a diagram illustrating one embodiment of a circuit 800 that includes a source follower resistor M2 in a feedback path is shown. In the illustrated embodiment, circuit 800 includes transistors M1 810 and M2 820, capacitor C1 865, and load 750.

In the illustrated embodiment, transistor M2 is configured as a source follower with its source terminal coupled to the drain terminal of M1, its gate terminal coupled co C1 and its drain terminal coupled to Vdd. Capacitor C1, in the illustrated embodiment, may allow DC biasing of transistor M2 (biasing circuitry not shown). The feedback path formed by C1, M2, and M1 may be configured to be stable over a range of frequencies or over all frequencies. In some embodiments, the feedback is positive at low frequencies and the loop gain should be smaller than one. In the illustrated embodiment, the loop gain may be smaller than one because the low frequency loop gain L may be expressed as:

$$L = \frac{g_{m1}[(g_{m2} + g_{ds2}) \cdot Z_L + 1]}{(g_{m1} + g_{ds1}) \cdot [(g_{m2} + g_{ds2}) \cdot Z_L + 1] + g_{ds2}} \quad (3)$$

where $g_m$ is transconductance and $g_{ds}$ is output conductance. In this embodiment, transistor M2 may reduce variation in the drain-source voltage of M1 which may improve linearity of circuit 800.

In various embodiments, the circuits of FIGS. 7 and 8 may implement techniques discussed with references to FIGS. 4-5. For example, in one embodiment, transistors M1 and/or M2 may be BJT's or any of various other types of transistors. As another example, in one embodiment, circuits 700 and/or 800 may include complimentary circuitry. FIGS. 7 and 8 are not intended as limiting but rather as illustrating exemplary embodiments of a feedback path.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A circuit, comprising:
   a first transistor having a first terminal, a second terminal, and a control terminal; and
   a non-parasitic feed-forward path coupled to the control terminal and the first terminal, wherein the feed-forward path includes first circuitry configured to:
      decouple the feed-forward path from a DC component of an input signal to the control terminal; and
      reduce a voltage between the first and second terminals based on the input signal;
      wherein the second terminal is coupled to an output of the circuit;
   a complementary transistor configured as a source follower, wherein a source terminal of the complementary transistor is coupled to the source terminal of the first transistor; and
   another feed-forward path coupled to a gate terminal of the complementary transistor and a drain terminal of the complementary transistor, wherein the another feed-forward path includes second circuitry configured to:
      decouple the another feed-forward path from a DC component of the input signal to the gate terminals of the first and complimentary transistors; and
      reduce a drain-source voltage of the complementary transistor based on the input signal.

2. The circuit of claim 1, wherein the control terminal is a gate terminal, the first terminal is a drain terminal and the second terminal is a source terminal, and wherein the first transistor is configured as a source follower.

3. The circuit of claim 2,
   wherein the first circuitry includes a second transistor configured as a source follower and configured to reduce the drain-source voltage of the first transistor; and
   wherein a source terminal of the second transistor is coupled to the drain terminal of the first transistor.

4. The circuit of claim 3, wherein the gate terminals of the first and second transistors are coupled to respective first and second AC coupling capacitors.

5. The circuit of claim 4, wherein the second AC coupling capacitor is configured to decouple the feed-forward path from a DC component of the input signal.

6. The circuit of claim 1, further comprising biasing circuitry coupled to the control terminal of the first transistor and configured to operate the first transistor in the saturation region.

7. The circuit of claim 1, further comprising a resistor coupled to the second terminal of the first transistor and configured to match an output impedance.

8. The circuit of claim 1, wherein the first circuitry includes a capacitor configured to decouple the feed-forward path from the DC component of the input signal.

9. The circuit of claim 1, wherein the control terminal is a base terminal, the first terminal is a collector terminal, and the second terminal is an emitter terminal.

10. The circuit of claim 1,
    wherein the first circuitry includes a second transistor having a first terminal, a second terminal, and a control terminal, wherein the second transistor is configured to reduce a voltage between the first and second terminals of the first transistor;
    wherein the second terminal of the second transistor is coupled to the first terminal of the first transistor; and
    wherein the control terminal of the second transistor is coupled to a circuit element configured to decouple the feed-forward path from the DC component of the input signal to the control terminal.

11. The circuit of claim 1, further comprising a matching resistor configured to match an impedance of a television cable, wherein the circuit is configured to buffer the input signal to the television cable.

12. A method, comprising:
   receiving an input signal at a gate terminal of a first transistor and a gate terminal of a complimentary transistor, wherein the first transistor is configured as a source follower and the complimentary transistor is configured as a source follower;
   generating, based on the input signal, a drain signal at a drain terminal of the first transistor, wherein the generating is performed using a non-parasitic feed-forward path and wherein the drain signal reduces variation of a drain-source voltage of the first transistor;
   generating, based on the input signal, a drain signal at a drain terminal of the complimentary transistor, wherein the generating is performed using another non-parasitic feed-forward path and wherein the drain signal reduces variation of a drain-source voltage of the complimentary transistor;
   decoupling the feed-forward path and the another feed-forward path from a DC component of the input signal; and generating, based on the input signal, an output signal at a source terminal of the first transistor and a source terminal of the complimentary transistor.

13. The method of claim 12, wherein the generating the drain signal is performed using a second transistor configured as a source follower in the feed-forward path and a third transistor configured as a source follower in the another feed-forward path.

14. The method of claim 12, wherein the decoupling is performed using a capacitor in the feed-forward path and a capacitor in the another feed-forward path.

15. The method of claim 12, further comprising:

transmitting the output signal via a television cable.

16. The method of claim 15, further comprising:

matching a load of the television cable using a resistor coupled to the source terminal of the first transistor.

17. A buffer circuit, comprising:

a first transistor having a first terminal, a second terminal, and a control terminal; and a feedback path coupled to the second terminal and the first terminal, wherein the feedback path includes circuitry configured to reduce variation of a voltage between the first and second terminals based on an output signal from the second terminal;

wherein the circuitry includes a second transistor, wherein a control terminal of the second transistor is directly coupled, via a capacitor, to the second terminal of the first transistor and a second terminal of the second transistor is coupled to the first terminal of the first transistor;

wherein the control terminal of the first transistor is coupled to receive an input signal to be buffered by the buffer circuit; and wherein the second terminal is coupled to an output of the buffer circuit.

* * * * *